(12) United States Patent
Robert et al.

(10) Patent No.: US 6,896,420 B2
(45) Date of Patent: *May 24, 2005

(54) MODULAR OPTOELECTRONIC CONNECTOR

(75) Inventors: Bernard Robert, Pontarlier (FR); Mostafa Zindine, Le Mans (FR); Bernard Brice, Levallois Perret (FR)

(73) Assignee: FCI, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/806,541

(22) Filed: Mar. 23, 2004

(65) Prior Publication Data

US 2004/0179791 A1 Sep. 16, 2004

Related U.S. Application Data

(63) Continuation of application No. 09/936,951, filed as application No. PCT/EP00/02747 on Mar. 2, 2000, now Pat. No. 6,758,606.

(30) Foreign Application Priority Data

Mar. 16, 1999 (FR) .............................................. 99 03222
Mar. 16, 1999 (FR) .............................................. 99 03224
Mar. 16, 1999 (FR) .............................................. 99 03226

(51) Int. Cl.[7] .............................................. G02B 6/36
(52) U.S. Cl. .............................. 385/88; 385/89; 385/92; 257/81
(58) Field of Search .......................... 385/88–94; 257/81

(56) References Cited

U.S. PATENT DOCUMENTS 3,963,920 A    6/1976  Palmer ...................... 250/239
5,345,527 A    9/1994  Lebby et al. ................ 385/114
5,367,593 A  * 11/1994 Lebby et al. ................. 385/53
5,675,685 A  * 10/1997 Fukuda et al. ................ 385/89
5,781,682 A    7/1998  Cohen et al. ................. 385/89
5,923,691 A  *  7/1999 Sato ........................... 372/46
6,758,606 B1 *  7/2004 Robert et al. ................. 385/88

FOREIGN PATENT DOCUMENTS

EP     0305112 A2    3/1989
EP     0864893 A2    9/1998
EP     0893861 A2    1/1999
WO     WO 96/09646   3/1996

OTHER PUBLICATIONS

Patent Abstract of Japan document No. JP 58210647.
Patent Abstract of Japan document No. JP 07146423.

* cited by examiner

*Primary Examiner*—Ellen E. Kim
(74) *Attorney, Agent, or Firm*—Perman & Green, LLP

(57) ABSTRACT

To resolve the problems of the manufacturing costs of an optoelectronic connector, an optoelectronic coupling integrated circuit chip (4) is mounted directly (12) into a package (1) of the connector. This package has an internal shielding metallization and metallizations (11) connected by microconnection techniques to pads (10) of the integrated circuit. The integrated circuit has laser diodes (8) on its surface also connected (13) to the pads (14) of this integrated circuit. These laser diodes are spaced out with respect to one another by a distance corresponding to a distance (21) between the optical fiber terminations (17, 20) in a standardized optical connector (16). The number of elements of the connector is reduced whereas, at the same time, its efficiency in terms of electrical consumption and in terms of transmission quality of a signal is improved.

13 Claims, 2 Drawing Sheets

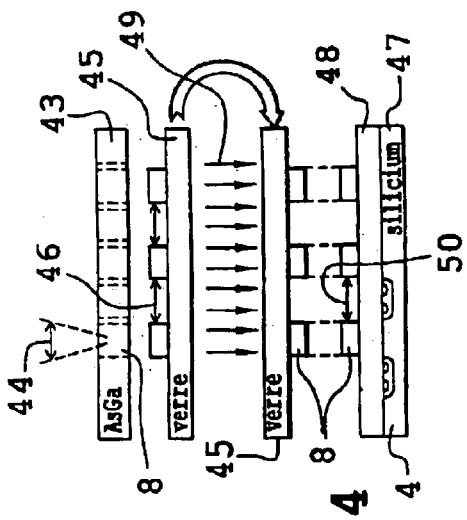
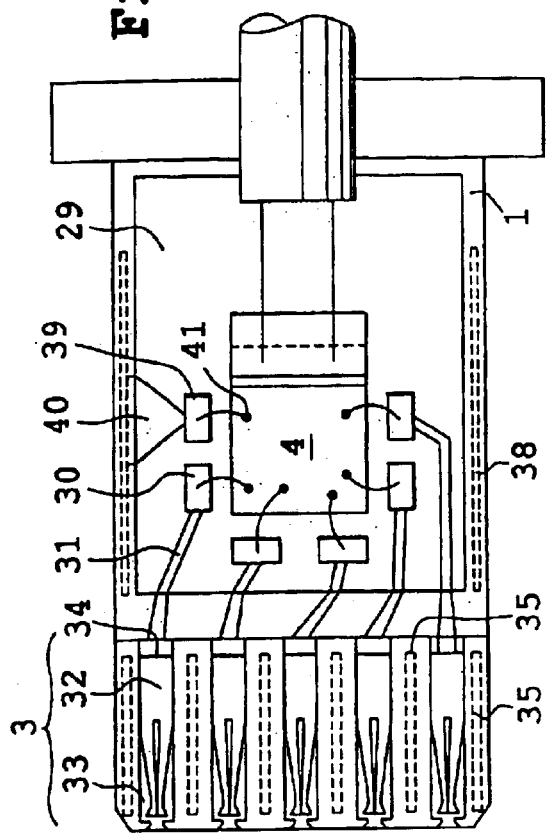
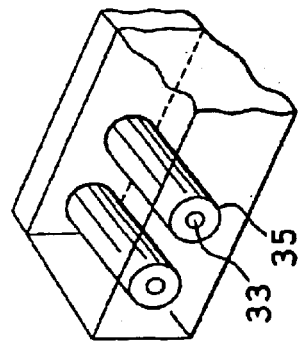
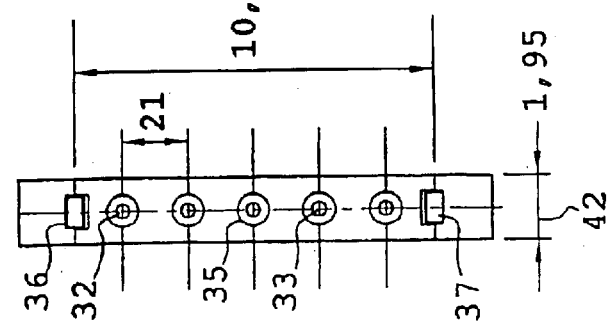

MODULAR OPTOELECTRONIC CONNECTOR

CROSS-REFERENCE TO RELATED APPLICATIONS

This application is a continuation of application Ser. No. 09/936,951 filed Dec. 10, 2001, now U.S. Pat. No. 6,758,606, which is the national stage of International Application No. PCT/EP00/02747, International Filing Date, Mar. 2, 2000.

BACKGROUND

An object of the present invention is a modular optoelectronic connector that can be used especially when high transmission bit rates are encountered. High bit rates of this kind are encountered for example in the field of telecommunications, especially for the interconnection of SDH type telephone exchanges. Each channel of an exchange of this kind must indeed give a bit rate of 622 Mbits. The expected developments are such that these bit rates must be raised to 2.5 Gbits and then 10 Gbits. High bit rates of this kind are furthermore being encountered in more limited spaces, as for example in computer local area networks or in aircraft. The bit rate requirements may then be also high owing to transmissions of image signals. Furthermore, inside one and the same piece of equipment, for example for the connection between several electronic racks in one and the same electronic cabinet, it may be planned to have very high bit rates.

To provide for the transmission of information of this kind without being hampered by problems of crosstalk or electromagnetic noise, it is preferred to use optical links. The invention pertains in fact to all optical links in which, ultimately, information has to be conveyed at a high information bit rate.

The preparation of information in electrical form and its transmission in optical form requires the making of optoelectronic couplers. In a first approach, devices have been developed in which an electronic card comprises an optoelectronic coupler of this kind. In this case, the electronic board can be accessed from outside by an optical connector. However, such an approach dictates the reservation of space on such an electronic board to make the electro-optical conversions. With a view to miniaturization, another approach is becoming prevalent. In this other approach, the coupler is an integral part of a connector. With this type of development, harnesses are appearing for example on the market. Harnesses of this kind comprise a cable and optoelectronic connectors at each of its ends. In a harness, the connectors are mounted on a cable. In the invention, it is thus planned, if necessary, to make harnesses of this kind. However, more generally in the invention, it is provided that the connectors may be distributed separately from the cables.

An optoelectronic connector according to the invention then comprises an electronic port linked to a coupler that is itself connected to an optical port. A cable to be connected to the optical port is an optical cable. At another end of a link, a reverse conversion is done, and another connector is mounted. For the user, on either side of the cable, the links are electrical. The optoelectronic conversion is transparent to the user. The advantage of these approaches is of course a gain in space on the electrical cards which no longer has to incorporate a coupling function. Another advantage is simplicity of use. All that remains is a constraint relating to the electrical supply of the coupler but this is done through the electrical port.

An embodiment of this kind however has the drawback of being costly to manufacture. Indeed, the technologies implied in such a connector require strict compliance with various physical constraints. Thus, on the electrical port side, given the high information bit rates (for example in the range of several Gbits), it is necessary to act efficiently to counter radioelectrical noises. In the coupler, it is necessary to take account of the problems of thermal dissipation of the transducers used. Indeed, the known transducers, namely laser diodes, can consume up to 100 milliwatts per unit. The heat dissipation related to the working of the transducer prompts a heating of this transducer, resulting in a drift in its operating frequency.

Cost-related problems, for their part, lead to the making of multifiber sets. Indeed, since the mounting of a connector for a single optical fiber is costly, the cost is substantially reduced by providing for the connections of bundles of optical fibers, For example, there are known embodiments in which twenty optical fibers are connected to a connector. However, while an embodiment of this kind leads to a reduction in the cost price per optical fiber of the connector, it does not accurately correspond to requirements. With embodiments of this kind, the user may have access either to a connector with very many optical fibers or to a connector with a single optical fiber. However the cost is high in both cases. In the invention, optoelectronic links are sought wherein it is possible to make use of a modularity: the user, as required, can associate a desired number of optical fibers to meet his requirements.

The making of multifiber sets furthermore leads to specific difficulties. Indeed, owing to heat consumption, laser diodes have to be separated from one another by a substantial space inside the connector. Similarly, when the optoelectronic connector is mounted on an electronic card, the laser diodes are spaced out so that they can be mounted therein. Besides, in order to be able to get connected to this type of connector, it is necessary to get close to a termination of an optical fiber of the optical radiating element of the coupler. Now, the multifiber optical connectors have a standardized distribution of the optical terminations. In this standardized distribution, the terminations are close to each other. It is then necessary to create a waveguide in the optoelectronic connectors. This waveguide enables a geometrical matching between the necessarily big spacing between the laser diodes mounted in the optoelectronic connector and a close spacing close of the terminations of the optical fibers presented in a standardized optical connector. The making of a waveguide of this kind complicates the coupler. This waveguide itself must also comply with the above-mentioned constraints.

In practice, to make optoelectronic connectors of this kind, laser diodes using Vcsel technology are used. The term Vcsel refers to vertical cavity solid emitting lasers. With vertical cavity solid emitting lasers of this kind, the laser radiation is actually scattered in a scattering cone whose angular aperture is about 8° to 12°. It becomes easier to place an optical fiber termination in front of a cone of this kind to pick up the optical signal sent. However, the presence, of the waveguide mentioned here above implies the making of two optical interfaces. A first interface is located between the laser diode and the input of the waveguide. A second interface is located at the output of the waveguide and at the input of the optical connector. These two interfaces lead to insertion losses which are themselves curbed by improving the quality of the optical terminations of the fibers of the optical connector and/or of the waveguides. For example, these ends of the fibers are polished by means of a plane or spherical polishing. If the polishing is plane, preferably it is slightly inclined with respect to the incident direction of the optical transmission so as not to prompt any parasitic reflections, both on the side of the interface with the laser diode and on the side of the interface with the optical connector. Ultimately, the presence of this waveguide results in a complex and costly structure if it is sought to prevent if from being a generator of transmission losses.

Furthermore, the electrical port that conveys the data elements must be especially well protected to prevent electromagnetic parasites. This shielding may be conventionally obtained by arrangements of metal partition walls. However, this type of approach is not compatible with desired goals of miniaturization and modularity of an optoelectronic connector. Or else, the manufacturing equipment becomes so precise that handling it runs counter to the conditions of very large-scale production.

In short, the approaches used for the prior art optoelectronic connectors are costly, not modular and do not have as good a transmission quality as would be desired.

SUMMARY OF THE EXEMPLARY EMBODIMENTS

It is an object of the invention to overcome these drawbacks by proposing an approach to the integration of the laser diodes into the optoelectronic connector that resolves all these problems simultaneously. According to a first embodiment of the invention, laser diodes are made by means of a weakly dissipative gallium arsenide (GaAs) technology. Using a thin layer transfer technique, these laser diodes are then placed directly on an integrated circuit comprising circuits for the driving, supply and amplification of the signals converted by the laser diodes. This direct transfer makes it possible to overcome the need for a printed circuit or a hybrid circuit which, in the prior art, enables the association of the laser diodes and the various electronic circuits needed to make them work.

This integrated circuit is itself directly placed in a package of the optoelectronic connector without being placed in an intermediate package that would contain it. Contact pads of this integrated circuit are connected to metallized zones made in a cavity of this package. Other pins of this integrated circuit are also connected to contact pads of one or more laser diodes transferred on this integrated circuit. These connections are made by wire bonding type microconnection techniques, ball grid array type or BGA type arrangements, or anisotropic type films. The package thus made is then sufficiently thin to be capable of being stacked at will and to enable the constitution of modular optoelectronic connectors with a number of electrical and/or optical ports that is determined at will.

Furthermore, the fact of transferring laser diodes, especially gallium arsenide laser diodes, on an integrated circuit that comprises all the functions needed for these diodes, enables them to be placed therein with a mutual spacing such that it is equal to the spacing with which the terminations of the optical fibers are presented in the standardized optical connector. By acting in this way, direct compatibility is then achieved with a standardized distribution of an optical connector. Thus, it becomes unnecessary to interpose an optical waveguide between the optoelectronic coupler and the optical port. Consequently, insertion losses in the optical fibers are smaller consequently, the care taken in the making of the optical connectors becomes less important while at the same time providing for greater efficiency. Naturally, the cost of the connector is reduced owing to the absence of this interposed waveguide.

The solution to the problems of shielding is then preferably obtained by making a package of the connector by means of MID technology. With a technology of this kind, it is possible in one pass to metallize a part of a structure, a package, made of plastic or any other material. In the invention, in this structure, mechanical receptacles are made designed to receive male or female contacts of the electrical port. These receptacles have for example the shape of a cylindrical tube. Through their metallized back, they are connected to a contact that is introduced therein. Furthermore, the external surface of these tubes is metallized and this external metallization is connected to a ground contact. The external metallization is used as a shielding. If need be, the rest of the structure is molded on this assembly. By acting in this way, with metallizations made in one or two passes, the need for handling the partition walls is removed. The method can easily be adapted to large-scale manufacture because the structures are preferably molded.

An object of the invention therefore is an optoelectronic connector comprising a package, an optical port, an electrical port, an optoelectronic circuit positioned in this package and connected to these two ports, characterized in that the optoelectronic circuit comprises a bare control and emission-detection integrated circuit chip, an internal wall of the package being provided with metallized connections, pads of this integrated circuit being connected directly to the metallized connections, laser diodes being transferred on the integrated circuit.

This connector is thus constituting a basic unit link. By juxtaposing such basic unit links, it is possible to simply and efficiently make multiple channel links. Thus, it is possible to set up a modular assembly of n links at very high bit rate or again a very high bit rate link obtained by the multiplexing of n links at a lower bit rate.

BRIEF DESCRIPTION OF THE DRAWINGS

The exemplary embodiments will be understood more clearly from the following description and the appended figures, which are given purely by way of an indication and in no way restrict the scope of the invention. Of these figures:

FIGS. 2a and 2b show two views (a top view and a front view) that are mutually perpendicular, of an optoelectronic connector module according to the invention;

FIG. 3 shows a schematic view in perspective of an embodiment of the package and of the electrical port of the connector of the invention;

FIG. 4 shows an embodiment of an integrated circuit than can be used in the connector of the invention.

DETAILED DESCRIPTION OF THE PREFERRED EMBODIMENT

Figure 1:
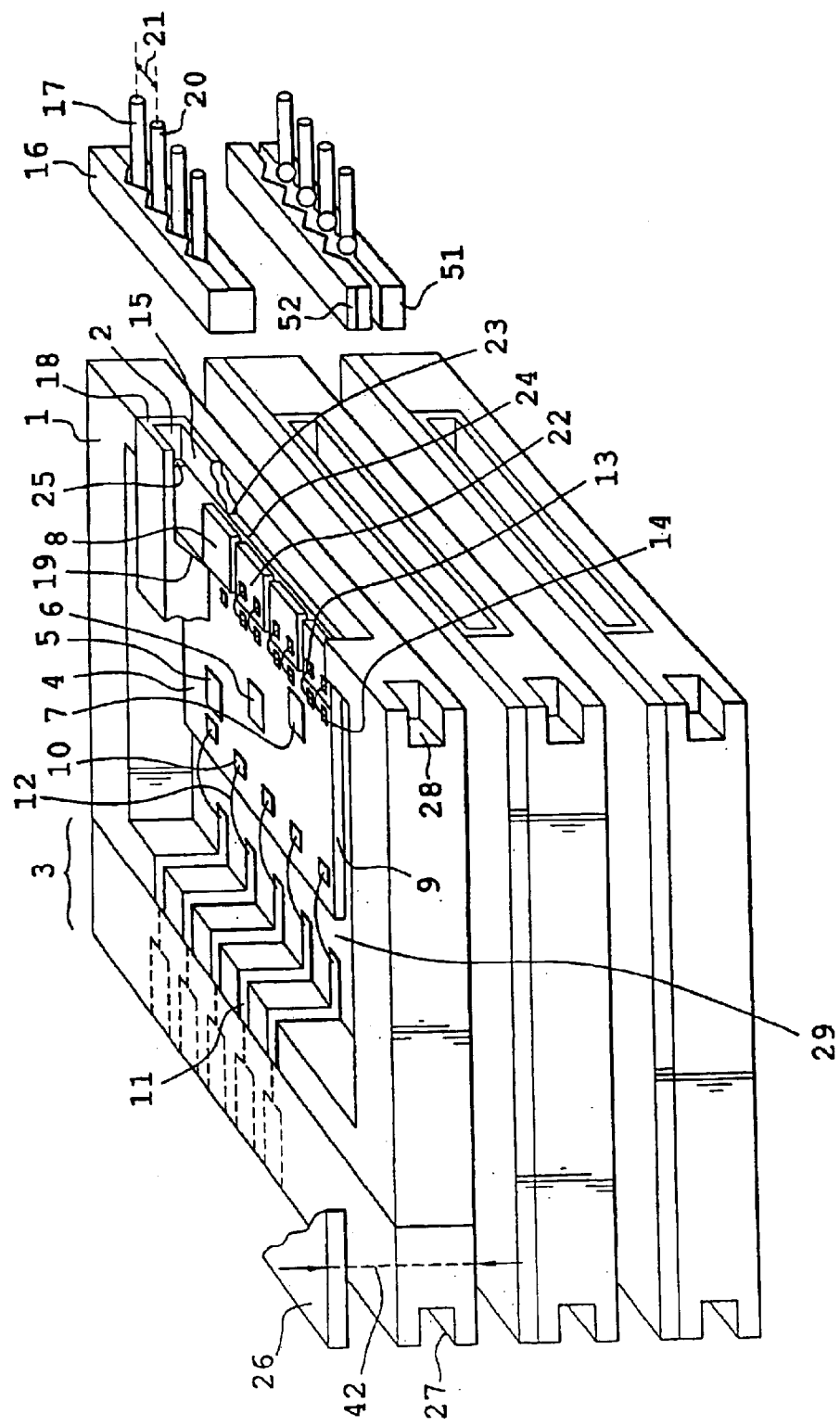
FIG. 1 shows a view in perspective of an optoelectronic connector according to the invention.

FIG. 1 shows a view in perspective of an optoelectronic connector according to the invention. This connector has a package 1, an optical port 2, and an electrical port 3. It also has an optoelectronic circuit 4 connected to these two ports. According to the invention, the optoelectronic circuit 4 is a control and transmission/detection integrated circuit chip, and the circuit 4 is bare, i.e. it is present in the package 1 without any conditioning package of its own. The circuit 4 is an integrated circuit having laser diodes and their controls.

In one example, the integrated circuit 4 has supply circuits 5, driving circuits 6 and amplification and the shaping circuits 7 to control the laser diodes such as 8. The circuits 5, 6 and 7 are integrated on one and the same semiconductor substrate 9, for example conventionally made of silicon. In a preferred exemplary embodiment, the substrate 9 has a dimension of about 4 mm by 4 mm. The integrated circuit thus cleared is sufficient to contain all the circuits 5, 6 and 7 needed to drive two or four laser diodes such as 8. The integrated circuit 4 has connection pads 10 on its surface, in this case its upper surface. These pads 10 are directly connected to metallizations 11 of the package 1. These links can be made in various ways. In one example, the electrical links are wire bonding type links. This type of link is made by an automatic machine capable of feeding a very thin wire and of soldering one end of a section 12 of this wire to a pad 10 and another end to a metallization 11 of the package. These machines are of a known type. The particular feature of the invention herein lies in the fact that the package of the optoelectronic connector 1 directly bears the metallizations 11 connected to the pad 10.

As shall be seen further below, the diodes such as 8 are not directly implanted in the integrated circuit but are preferably transferred therein. Indeed, the laser diodes used will preferably be gallium arsenide GaAs diodes. These diodes 8 also have connection pads 13. The pads 13 are connected by the same connection machine to pads 14 of the substrate of the integrated circuit.

The technique of wire bonding is not the only technique possible. There is also the BGA technique in which solder balls are deposited on the pads such as 14 and 10 and are melted when they are put into contact with metallizations 11 or pads 13 of another circuit element. There also exists another technology known as an aniostropic film connection technology. All these microscopic connection techniques can be used to make the connection of the integrated circuit 4 into the package 1 and the diodes 8 on the substrate of the circuit 4. In the example shown, the circuit 4 is for example bonded to the back of the package 1.

The package 1, in order that it may be very small, is a package of the type using metallizations. It is made for example by means of what is called a MID (molded interconnection device) technology. Without going into detail for the implementation of a technique of this kind, a molded (plastic) shape is made having the requisite relief features and shapes. A selective chemical etching operation is then carried out on a surface of the molded part with the activation of this surface, in particular with palladium. The selective etching is done for example after preliminary photomasking. The activation of the material of the package that results from this etching produces a locally distributed catalyst that efficiently receives a metallization layer. The metallization layer obtained by the deposition of a metal adopts the geometry of the etching and enables the making of the metallized surfaces, such as the strip 11, with a desired shape. This operation can be done once with one pass. It is however, possible to make a molding over the part thus metallized with another cover made of plastic for example and restart the metallization operation. Thus, a metallized package is obtained in two passes. The value of using a metallization in two passes makes it possible, as shall be seen further below, to make efficient electrical shieldings.

The package 1 also has the optical port 2. This optical port 2 essentially comprises a receptacle 15 to receive an optical connector 16, which is preferably a standardized optical connector. The receptacle 15 has walls that are used to guide and orient walls of the connector 16. Thus guided by these walls, optical terminations of optical fibers 17 of the connector 16 are presented to the light radiation emitted by the laser diodes 8. In the preferred exemplary embodiment, where the diodes 8 are transferred on the integrated circuit 4, they emit their light radiation in a direction substantially perpendicular to the surface of the integrated circuit 4. The optical port 2 then comprises for example a guiding part 18 provided with walls 15 and furthermore having an inclined face 19 in front of the optical terminations. The inclined face 19 is inclined in one example by 45° to the perpendicular to the plane of the integrated circuit 4 and with respect to the direction of insertion of the connector 16 into the port 2. This inclined face 19 is furthermore treated so that it is particularly reflective, for example by means of a layer of metal deposited on a plastic or silicon part 18. The inclined face 19 then reflects the radiation emitted by the laser diodes 8 towards the optical terminations of the optical fibers 17. The dismountable connector 16 can also be replaced by a non-dismountable positioning block. This non-dismountable block may consist of a precision molded plastic element (the molding provides for a precision of within one micrometer) or a silicon part with positioning Vee elements.

To provide for perfect securing of the guidance part 18 with respect to the diodes 8, the optoelectronic connector of the invention has two main characteristics. First of all, the diodes 8 are placed on the surface of the integrated circuit 4 with a space between them that is equal to a space 21 between two consecutive optical fibers 17 and 20 in the connector 16. The space 21 is thus the one that exists between a diode 8 and another diode 22 that is contiguous to it in the circuit 4. Furthermore, the part 18 has a securing edge 2 that is placed so that it abuts a cant 24 of the integrated circuit 4. By acting in this way, without any intermediate device, it is ensured that the optical terminations of the fibers 17 and 20 will be placed at the best position with respect to the transmission surfaces of the diodes 8 and 22.

It will be noted that it is possible to use an optical connector 16 of the type that is commercially available and use it to pick up the optical signal delivered by the diodes 8 and 22. All that is required is that the faces 15 of the optical port 2 should have dimensions corresponding to the type of optical connector 16 used. At least one of the faces of the optical port 2 will have a means of blocking the progress of the optical connector 16. For example, this can be obtained by a recess 25 in this face that is perpendicular to the direction of insertion of the optical connector 16 into the port 2.

FIG. 1 shows the optoelectronic connector of the invention presented in the form of a module. Each module has a package 1 as well as a lid 26. The lid 26 is metallized at the appropriate places to contribute to the accurate shielding of the cavity of the package 1 in which the integrated circuit 4, the laser diodes and the various metallizations are located. For example, this lid may be metallized beneath its entire surface except at the position of the passage of the metallizations 11 above an upper shoulder of the cavity 29. The lid is thus of the MID type. In one very schematic example, the package 1 has relief features such as 27 and 28 to catch into an overall external structure that makes it possible to contain a certain number of them as required. As the case may be, the packages 1 and/or the lid 26 have raised relief parts (especially of the dovetailed type) used to associate two or more modules together.

FIGS. 2a and 2b repeat the elements of FIG. 1 and give an even clearer view of the embodiment of the metallized package 1. At the back of a cavity 29 of this package 1, metallized pads 30 are placed connected to metallized connections 31 ending in the electrical port 3. In a preferred way, to facilitate modularity, the optoelectronic connector of the invention will be a connector with two, four or even eight optical channels. An optical channel can extend in an outgoing sense or in an incoming sense of the propagation of an optical signal or in a to-and-fro sense or again in a sense of optical propagation of a data signal and a sense of a clock optical signal.

In practice, according to a preferred embodiment, the package of the invention will have two or four connected optical fibers. In this preferred version, the package will have five metallized tracks (of the MID type) individually connected to five contacts for connection to the electrical port 3.

In one example, the connection contacts to the electrical port 3 are female contacts 32. Each contact is mounted in a housing 33 of the port 3 and is connected by its back 34 to one end of a metallized track 31. To carry out the electromagnetic shielding, each housing 33 is surrounded by a metal shielding 35 for which FIG. 3 shows a view in perspective. In practice, for reasons of electrical insulation, a MID type metallization of the package will be used with two passes in this case. FIG. 3 gives a view, for a tube surrounding the housing 33, of the metallization 35 that shields the housing. The remainder of the electrical port 3 is then molded over these tubes. The shielding metallizations are furthermore connected to tracks of the package connected to the ground.

FIG. 2b provides a view, in order to give an idea of the size of the connector, of the dimensions in millimeters of the electrical port 3 proposed. This electrical port 3 has two ground contacts 36 and 37 at a distance of 10.5 millimeters from each other. The ground contacts 36 and 37 are connected to the shielding 35 of the pads as well as to a shielding 38 of the cavity 29. The shielding 38 is itself connected by a pad 39 and by a metallized connection 40 to a pad 41 of the integrated circuit 4 and to the shielding of the lid. In this embodiment, the distance between the consecutive contacts 32 of the electrical port 3 is 2 millimeters. In this preferred embodiment, the thickness 42 of the package including its lid 26 is about 1.95 millimeters.

FIG. 4 shows a preferred exemplary view of the direct transfer of laser diodes on the integrated circuit 2. In a first step, laser diodes are laid out on a gallium arsenide substrate 43. Preferably, these diodes are Vcsel. (vertical cavity solid emitting laser) type diodes. Laser diodes manufactured according to this technology have the advantage of distributing their radiation not in only one direction but in a cone 44 whose aperture is in the range of six to twelve degrees, permitting a tolerance for the positioning of the terminations of the optical fibers facing this light source and creating favorable conditions for the insertion of the optical signal into an optical fiber. As a variant, the terminations of the optical fibers are polished and may have a spherical shape so as to take account of a misalignment of the orientation of this optical fiber termination with respect to the direction of emission of the laser diode. In the preferred solution of the invention, the termination face of the optical fibers presented by the connector 16 will be slightly inclined to prevent reflections by this face towards the laser diode and the fiber itself. Indeed, preferably the laser diode, especially when it is of the GaAs type, will be a reversible diode, namely a diode capable of working both in emission and in detection. Otherwise, for the detection, PIN diodes will be used mounted in the same way on the circuit 4. Or again the PIN diodes can be directly made by epitaxy on the circuit 4.

The diode elements can be manufactured on GaAs plates in batches and very close to one another. Thus, a plate may comprise several thousands of diodes. These diodes may be mounted on the silicon chip either individually with standard transfer machines or automatically by using a direct assembling technology. This technology has the advantage of mounting only tested diode, reducing the complexity of the electrical connection of the diodes and achieving major savings with respect to the manufacturing method. By acting in this way and furthermore limiting the number of connectable optical fibers, a structure of the optical port is obtained that is low cost and furthermore compatible with commercially available optical connectors 16.

In one example, from the substrate 43, the diode elements are deposited on an intermediate support, for example a glass plate 45. The laser diodes are deposited on this glass plate with a spacing 46 equal to the spacing 21 referred to here above. If need be, the glass plate 46 exists from the very time when the laser diodes are laid out in the overlaid substrate 43. Then the substrate can be etched to allow only the diodes to remain. Then this glass plate is turned over and presented so that it faces an integrated circuit 4 formed on a silicon substrate. This integrated circuit has a substrate layer 47 and an interconnection layer 48. For the mounting of the diodes 8 on the integrated circuit 4, it can be planned to transfer them either before the interconnection phase 48 or after it. In this later case, the diodes should be connected by links between their pads 13 and pads 14 of the integrated circuit 4. The transfer is done by subjecting the glass plate 45 to laser insolation 49. The laser insolation which is a flash may be general or selective. The diodes 8 subjected to his flash get loosened and are moved on to the integrated circuit 4. They are then presented on the integrated circuit 4 with a distance 50 between them equal to the distance 46 that separated them on the glass plate 45. By acting in this way and furthermore limiting the number of connectable optical fibers, a structure of the optical port is obtained that is low cost and furthermore compatible with commercially available optical connectors 16.

In one example, the optical connectors 16 are formed by two jaws 51 and 52 having V-shaped grooves capable of receiving and positioning optical fibers with a precision better than one micrometer. There are ferrules in which the positioning of the fibers is achieved not by Vees but by holes made in a plastic block. The use of laser diodes whose size is in the range of 10 micrometers, coupled with mutlimode fibers with a core size of 62 micrometers, makes it possible to envisage the positioning of the fiber with a precision of 10 micrometers, which is quite sufficient. Thus, the connector 16 could be replaced by a plastic positioning part that is more economical to make.

The technique of directly transferring laser diodes on the integrated circuit 2 makes it possible to envisage voltage levels limited to 1.5 volts instead of the 5 volts generally encountered in the prior art when the laser diodes are individually packaged and brought to a printed circuit. A technology of this kind will therefore go together with a reduction in consumption. In practice, a consumption level of about 1 milliwatt per diode is achieved instead of the 10 milliwatts consumed in the prior art. Thus, it is fairly easy to bring the diodes closer together and especially to hold at least two of them on one and the same substrate 4 without any risk of any major drift in the operating characteristics of the diodes of the integrated circuit 4 through an excessive rise in their temperature.

Furthermore, the limiting of the heating is accompanied by a smaller drift in the laser diodes. This, in particular, leads to a simplification of the driving circuits 6 (furthermore reduces the thermal dissipation).

The approach presented in the invention has the advantage of being totally industrial and of limiting manual operations, by reducing them to simple handling operations in preventing intervention especially entailing the use of binoculars. It is well suited to batch production. Thus, the invention achieves the desired result of obtaining an optoelectronic connection module whose cost price, at least for the connection of two optical fibers, is proportionally smaller than the cost of making a connector for a large number of optical fibers. The process of the batch transfer of the laser diodes to one or more integrated circuits 4 makes it possible to reduce the cost of the optoelectronic component.

As a variant, the guidance part 18 is an integral part of the optoelectronic connector. This part 18 is then in the package in a position such that the mirror 19 is located above the laser diodes 8. It is also possible to consider doing without the inclined face 19 by making optical fiber terminations that are curved so that their section is presented before the emission cone of the diodes 8. In another variant, the integrated circuit 4 is shown vertically in the package 1 so that the radiation of the diodes 8 is oriented to be facing the direction in which the connector 16 is introduced into the port 2. As an alternative, the part 18 has jaws such as 51 and 52 to receive ferrules of optical fibers.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An optoelectronic connector comprising a package, an optical port, an electrical port, an optoelectronic circuit positioned in the package and connected to the optical port and electrical port, the optoelectronic circuit comprising a bare control and emission detection integrated circuit chip, an internal wall of the package being provided with metallized connections, pads of the integrated circuit being connected directly to the metallized connections, wherein the connector comprises laser diodes on the integrated circuit chip, the laser diodes being formed in a predetermined arrangement from a gallium arsenide substrate and deposited on the integrated circuit chip by transfer from an intermediate support that maintains the predetermined arrangement, the connector defining a base unit link.

2. The connector according to claim 1, wherein the laser diodes are transferred on the integrated circuit with a space between the diodes equal to a space between optical fiber terminations in the optical port.

3. The connector according to claim 1, wherein the package is a MID package made by means of a method with metallizations in two passes.

4. The connector according to claim 1, wherein the package is a MID package connected to the integrated circuit by BGA connections, wire bonding or anisotropic film technology.

5. The connector according to claim 1, wherein shielding of the package is of a MID shielding.

6. The connector according to claim 1 wherein the laser diodes are VCSEL diodes, of GaAs material.

7. The connector according to claim 1, wherein the optical port comprises an inclined mirror, inclined at about 45°.

8. The connector according to claim 1, wherein the optical port comprises a part for positioning optical fiber terminations, this part abutting a cant of the integrated circuit.

9. The connector according to claim 1, wherein the optical port comprises a limited access with two optical channels and in that the electrical port comprises contacts for electrical signals and contacts for a ground signal.

10. The connector according to claim 1, wherein the package is a module and comprises means to be stacked on another package.

11. The connector according to claim 1, wherein pads of the laser diodes are connected by connection wires directly to pads of the integrated circuit.

12. The connector according to claim 1, wherein the optoelectronic circuit comprises means to carry out a conversion of the signals available at the optical port into signals available at the electrical port and/or vice versa.

13. The connector according to claim 1, wherein each laser diode has a contact surface for contacting the intermediate support.

* * * * *